United States Patent
Hori

(10) Patent No.: US 10,396,112 B2
(45) Date of Patent: Aug. 27, 2019

(54) IMAGING APPARATUS AND ELECTRONIC APPARATUS

(71) Applicant: Sony Corporation, Tokyo (JP)

(72) Inventor: Kiyotaka Hori, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/019,018

(22) Filed: Jun. 26, 2018

(65) Prior Publication Data

US 2018/0308887 A1 Oct. 25, 2018

Related U.S. Application Data

(63) Continuation of application No. 15/599,135, filed on May 18, 2017, now Pat. No. 10,043,839, which is a continuation of application No. 14/457,624, filed on Aug. 12, 2014, now Pat. No. 9,679,930.

(30) Foreign Application Priority Data

Aug. 19, 2013 (JP) .................................. 2013-169357

(51) Int. Cl.
*H01L 27/146* (2006.01)

(52) U.S. Cl.
CPC ............... *H01L 27/14618* (2013.01); *H01L 2224/32145* (2013.01); *H01L 2224/48091* (2013.01); *H01L 2224/73265* (2013.01)

(58) Field of Classification Search
CPC ............. H01L 27/14618; H01L 27/146; H01L 27/148; H01L 2224/32145; H01L 2224/73265; H01L 2224/48091; H01L 2924/00014; H01L 27/14643; H01L 27/14806

See application file for complete search history.

(56) References Cited

U.S. PATENT DOCUMENTS

| | | | | | |
|---|---|---|---|---|---|
| 5,200,367 A | * | 4/1993 | Ko | .......................... | H01L 21/50 174/529 |
| 5,350,713 A | * | 9/1994 | Liang | .................... | H01L 23/315 156/245 |
| 5,458,716 A | * | 10/1995 | Alfaro | ..................... | H01L 21/50 156/245 |
| 5,572,065 A | * | 11/1996 | Burns | ..................... | H01L 21/50 257/666 |
| 6,333,564 B1 | * | 12/2001 | Katoh | ................. | H01L 23/3107 257/738 |
| 6,489,178 B2 | * | 12/2002 | Coyle | ............... | B29C 45/14655 438/51 |
| 6,674,159 B1 | * | 1/2004 | Peterson | ............... | B81B 7/0067 257/431 |

(Continued)

FOREIGN PATENT DOCUMENTS

JP 2011-030173 2/2011

*Primary Examiner* — John R Lee
(74) *Attorney, Agent, or Firm* — Sheridan Ross P.C.

(57) ABSTRACT

An imaging apparatus includes: an interposer on which an image sensor including a light reception section is disposed; a translucent member that is provided on the light reception section; and a mold that is formed in sides of the interposer having a rectangular shape and bonded to the translucent member to support the translucent member, the mold including a seal surface that is bonded to the translucent member, the seal surface being provided with a protrusion.

20 Claims, 7 Drawing Sheets

(56) References Cited

U.S. PATENT DOCUMENTS

| | | | | |
|---|---|---|---|---|
| 7,135,768 B2* | 11/2006 | Crane, Jr. | H01L 21/50 | 257/710 |
| 7,417,198 B2* | 8/2008 | Betz | H01L 23/047 | 174/536 |
| 7,646,094 B2* | 1/2010 | Suminoe | H01L 23/057 | 257/737 |
| 7,791,184 B2* | 9/2010 | Wood | H01L 27/14618 | 257/434 |
| 8,053,953 B2* | 11/2011 | Yamada | B81B 7/0051 | 310/348 |
| 9,155,212 B2* | 10/2015 | Tsuduki | H05K 5/0091 | |
| 9,679,930 B2* | 6/2017 | Hori | H01L 27/14618 | |
| 10,043,839 B2* | 8/2018 | Hori | H01L 27/14618 | |
| 2003/0042598 A1* | 3/2003 | Crane, Jr. | H01L 21/50 | 257/710 |
| 2006/0221225 A1* | 10/2006 | Tsukamoto | H01L 27/14618 | 348/340 |
| 2008/0132002 A1* | 6/2008 | Inao | H01L 21/4842 | 438/116 |
| 2010/0103296 A1* | 4/2010 | Nakagiri | H01L 27/14618 | 348/294 |
| 2010/0258523 A1* | 10/2010 | Ootera | B82Y 10/00 | 216/11 |
| 2012/0218455 A1* | 8/2012 | Imai | G02B 13/001 | 348/340 |
| 2013/0001398 A1* | 1/2013 | Wada | G02B 19/0085 | 250/206.1 |
| 2013/0221470 A1* | 8/2013 | Kinsman | H01L 27/14618 | 257/434 |
| 2014/0252569 A1* | 9/2014 | Ikuma | H01L 23/66 | 257/659 |
| 2015/0048240 A1* | 2/2015 | Hori | H01L 27/14618 | 250/208.1 |
| 2016/0243734 A1* | 8/2016 | Pitzek | B01L 3/502707 | |
| 2017/0256578 A1* | 9/2017 | Hori | H01L 27/14618 | |
| 2018/0308887 A1* | 10/2018 | Hori | H01L 27/14618 | |

* cited by examiner

IMAGING APPARATUS AND ELECTRONIC APPARATUS

CROSS REFERENCE TO RELATED APPLICATIONS

This application is a continuation of U.S. patent application Ser. No. 15/599,135, filed May 18, 2017, which is a continuation of U.S. patent application Ser. No. 14/457,624, filed Aug. 12, 2014, now U.S. Pat. No. 9,679,930, which claims the benefit of Japanese Priority Patent Application JP 2013-169357 filed Aug. 19, 2013, the entire disclosures of which are incorporated herein by reference.

BACKGROUND

The present technology relates to an imaging apparatus and an electronic apparatus and in particular to an imaging apparatus and an electronic apparatus by which generation of defects in adhesion of a translucent member such as glass in the imaging apparatus can be suppressed.

In the related art, charge coupled device (CCD) image sensors, complementary metal oxide semiconductor (CMOS) image sensors, and the like as semiconductor devices have been utilized in various fields.

A light reception surface of an image sensor has a concavo-convex shape due to micro lenses provided in respective pixels. In general, for preventing the light reception surface from catching foreign matters, the image sensor is configured to protect the light reception surface by a transmissive lid such as glass.

Specifically, in order to protect the light reception surface of the image sensor, in which a plurality of pixels that receive light are arranged, the imaging apparatus is configured such that a rib is formed on a substrate (interposer) on which the image sensor is disposed and glass is placed on the rib. The light reception surface of the image sensor and the glass have a hollow structure therebetween.

In addition, there has been proposed a technique in which a rib that fixes an outer periphery of glass is formed of a mold (resin) to thereby ensure a larger distance between the light reception surface and the glass (e.g., see Japanese Patent Application Laid-open No. 2011-030173 (hereinafter, referred to as Patent Document 1).

By the technique described in Patent Document 1, the mold resin can be set to have such a height that effects of particles can be overcome and the effects of particles of the glass can be reduced. Thus, generation of a captured image having a shadow can be prevented, for example.

SUMMARY

In the related art, in molding (resin) on the substrate (interposer) on which the image sensor is disposed, a process of heating at high temperature for thermo-setting the mold resin and a process of cooling at room temperature after that have to be performed. Due to a difference in thermal expansion between the interposer and the mold at this time, an adhesive surface of the mold can be bent back.

Therefore, in the related art, due to the bent back adhesive surface of the mold, an adhesive for adhering the glass becomes thin in some areas and a void defect in the adhesive layer or the like is generated.

In view of the above-mentioned circumstances, it is desirable to suppress generation of defects in adhesion of a translucent member such as glass in an imaging apparatus.

According to a first embodiment of the present technology, there is provided an imaging apparatus including: an interposer on which an image sensor including a light reception section is disposed; a translucent member that is provided on the light reception section; and a mold that is formed in sides of the interposer having a rectangular shape and bonded to the translucent member to support the translucent member, the mold including a seal surface that is bonded to the translucent member, the seal surface being provided with a protrusion.

The protrusion may include at least three protrusions.

The light reception surface of the image sensor and the translucent member may have a hollow structure therebetween.

The mold and the translucent member may be bonded to each other with one of a thermosetting resin and an ultraviolet curing resin.

The mold may be made of an epoxy resin composition.

The protrusion may be formed by shaping the mold with a die.

The protrusion may be configured as a protrusion having one of a circular shape and a rectangular shape, and one of the circular shape and the rectangular shape of the protrusion may have one of a diameter and a width of from 1 μm to an overlap length of the seal surface and the translucent member.

The protrusion may have a height of from 1 μm to 1 mm.

The protrusion may have a height of from 50 μm to 100 μm.

The interposer may be made of one of a glass epoxy and a ceramic.

On the interposer, a signal processing chip having a function as one of an analog-to-digital converter (DC) and a digital signal processor (DSP) may be further disposed.

According to a second embodiment of the present technology, there is provided an electronic apparatus including an imaging apparatus including an interposer on which an image sensor including a light reception section is disposed, a translucent member that is provided on the light reception section, and a mold that is formed in sides of the interposer having a rectangular shape and bonded to the translucent member to support the translucent member, the mold including a seal surface that is bonded to the translucent member, the seal surface being provided with a protrusion.

In the first and second embodiments of the present technology, the protrusion is formed in the seal surface of the mold to be bonded to the translucent member.

According to the embodiments of the present technology, it is possible to suppress generation of defects in adhesion of a translucent member such as glass in an imaging apparatus.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present technology disclosed herein will be described with reference to the drawings.

First, a problem in the related art will be described.

Figure 1:
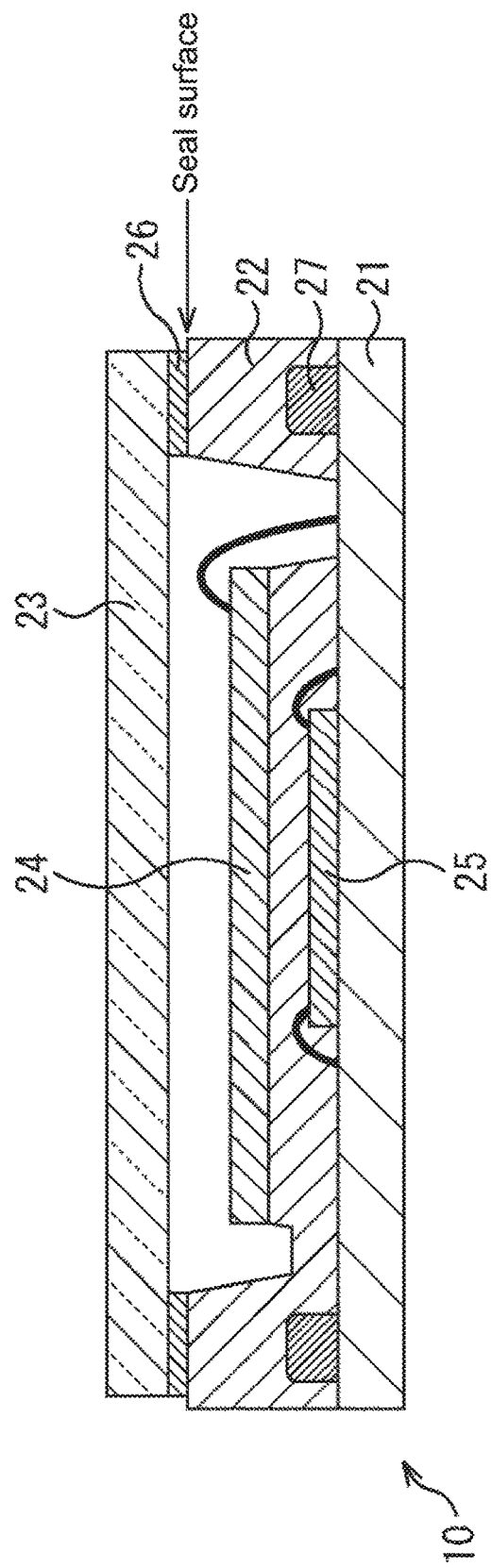
FIG. 1 is a cross-sectional view of an imaging apparatus in the related art.

FIG. 1 is a cross-sectional view of an imaging apparatus in the related art.

An imaging apparatus 10 shown in FIG. 1 includes an interposer 21. The interposer 21 is provided with a mold 22 in a periphery thereof. Glass 23 is placed on the mold 22.

Specifically, the interposer 21 is provided at the bottom of the imaging apparatus 10. A signal processing chip 25 is disposed at the center of the interposer 21. Components such as a capacitor and a resistor (referred to as CR components) 27 are disposed at the left and right of the interposer 21 in FIG. 1. The mold 22 is formed on the interposer 21. An image sensor (sensor chip) 24 is disposed on the mold 22 at the center of the interposer 21. The glass 23 is disposed on the mold 22 in the periphery of the interposer 21.

Note that, in FIG. 1, the image sensor 24 is disposed with a light reception surface thereof being directed upward in FIG. 1.

As shown in FIG. 1, in the imaging apparatus 10, the light reception surface of the image sensor 24 and the glass 23 have a hollow structure therebetween.

The mold 22 and the glass 23 are bonded to each other with an adhesive 26. Note that the mold 22 is provided on four sides of the interposer 21 having a rectangular shape and bonded to the glass 23 at the four sides to support the glass 23. In FIG. 1, portions of the mold 22, which correspond to two of the four sides on which the mold 22, is provided support the glass 23.

An upper surface of the mold 22 in FIG. 1, which is a surface in contact with the glass 23, will be referred to as a seal surface. The adhesive 26 is inserted between the seal surface and the glass 23, such that an adhesive layer is formed.

However, in forming the mold 22 on the interposer 21, a process of heating at high temperature for thermo-setting the mold resin and a process of cooling at room temperature after that have to be performed. Due to a difference in thermal expansion between the interposer 21 and the mold 22 at this time, the seal surface of the mold 22 is bent back.

Figure 2:
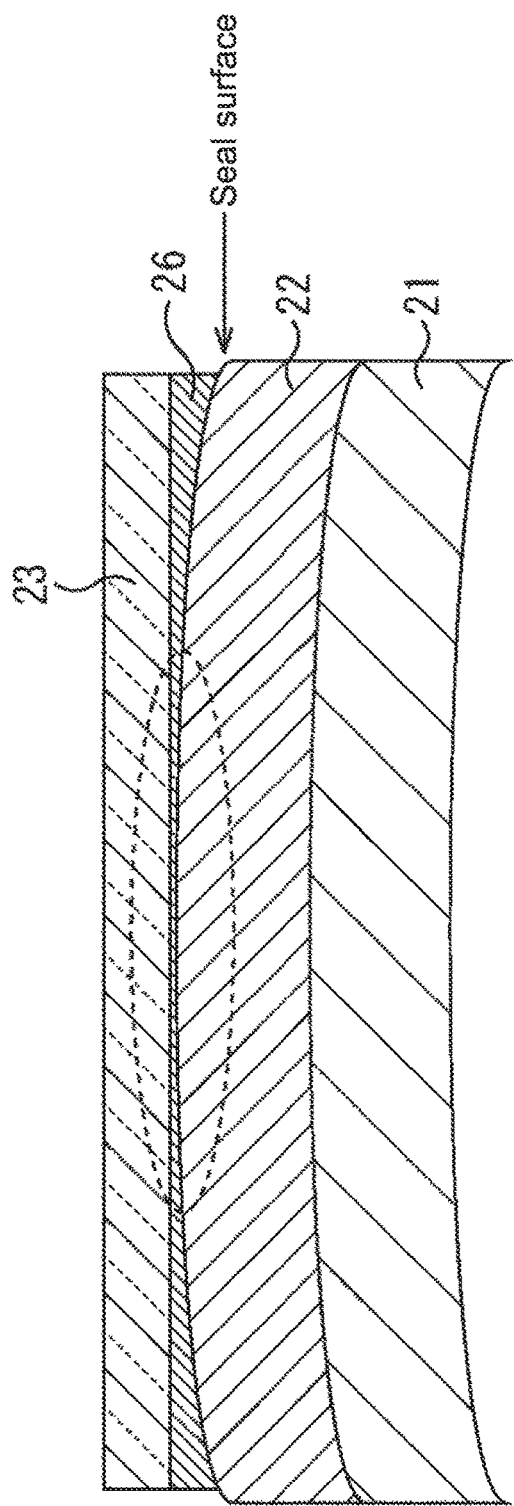
FIG. 2 is a cross-sectional view showing a bonding portion between a seal surface of a mold and glass that are shown in FIG. 1.

FIG. 2 is a cross-sectional view showing a bonding portion between the seal surface of the mold 22 and the glass 23 that are shown in FIG. 1. In FIG. 2, the seal surface of the mold 22 is bent back at the center in FIG. 2 and the center of the mold 22 is slightly pushed up. Therefore, the mold 22 is slightly high at the center thereof in FIG. 2 and slightly low at left and right ends thereof in FIG. 2.

With this, in FIG. 2, in the layer of the adhesive 26 inserted between the glass 23 and the seal surface of the mold 22, the adhesive 26 near the center thereof in FIG. 2 (region enclosed by dashed line ellipse) are excessively reduced. Thus, in FIG. 2, a void defect is generated in the layer of the adhesive 26. Due to such a void defect, the glass 23 is not correctly fixed, which results in changes in rays incident upon the light reception surface of the image sensor 24 and particles caught between the light reception surface of the image sensor 24 and the glass 23.

Therefore, the present technology prevents generation of the void defect.

Figure 3:
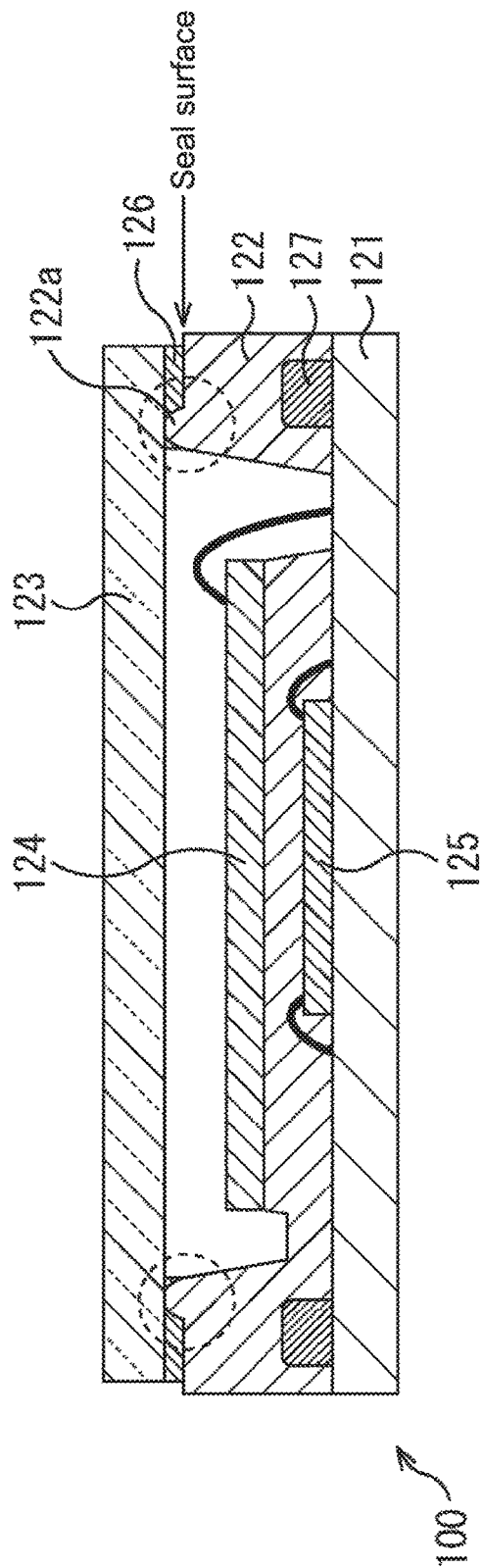
FIG. 3 is a cross-sectional view of an imaging apparatus to which the present technology is applied.

FIG. 3 is a cross-sectional view of an imaging apparatus to which the present technology is applied.

As in the imaging apparatus 10 shown in FIG. 1, an imaging apparatus 100 shown in FIG. 3 includes an interposer 121. The interposer 121 is provided with mold 122 in a periphery thereof. Glass 123 is placed on the mold 122.

Specifically, the interposer 121 is provided at the bottom of the imaging apparatus 100. A signal processing chip 125 is disposed at the center of the interposer 121. Components such as a capacitor and a resistor (referred to as CR components) 127 are disposed at the left and right of the interposer 121 in FIG. 3. The mold 122 are formed on the interposer 121. An image sensor (sensor chip) 124 is disposed on the mold 122 at the center of the interposer 121. The glass 123 is disposed on the mold 122 in the periphery of the interposer 121.

Note that the image sensor 124 is disposed with the image sensor 124 thereof being directed upward in FIG. 3. The signal processing chip 125 is configured as a large-scale integration (LSI) having a function as an analog-to-digital converter (DC), a digital signal processor (DSP), or the like.

The interposer 121 is made of, for example, a glass epoxy or a ceramic. The mold 122 is made of, for example, an epoxy resin composition.

As shown in FIG. 3, in the imaging apparatus 100, the light reception surface of the image sensor 124 and the glass 123 have a hollow structure therebetween.

The mold 122 and the glass 123 are bonded to each other with an adhesive 126. Note that the mold 122 is provided on four sides of the interposer 121 having a rectangular shape and bonded to the glass 123 at the four sides to support the glass 123. In FIG. 3, portions of the mold 122, which correspond to two of the four sides on which the mold 122 is provided, support the glass 123.

An upper surface of the mold 122 in FIG. 3, which is a surface in contact with the glass 123, will be referred to as a seal surface. The adhesive 126 is inserted between the seal surface and the glass 123, such that an adhesive layer is formed.

Note that examples of the adhesive 126 may include a thermosetting resin and an ultraviolet curing resin.

Unlike the case shown in FIG. 1, the seal surface of the mold 122 of the imaging apparatus 100 shown in FIG. 3 is provided with protrusions 122a at regions indicated by dashed line circles in FIG. 3. Tips of the protrusion 122a are in contact with a lower surface of the glass 123 in FIG. 3.

The protrusions 122a of the mold 122 of the imaging apparatus 100 are formed by, for example, shaping with a die.

Figure 4:
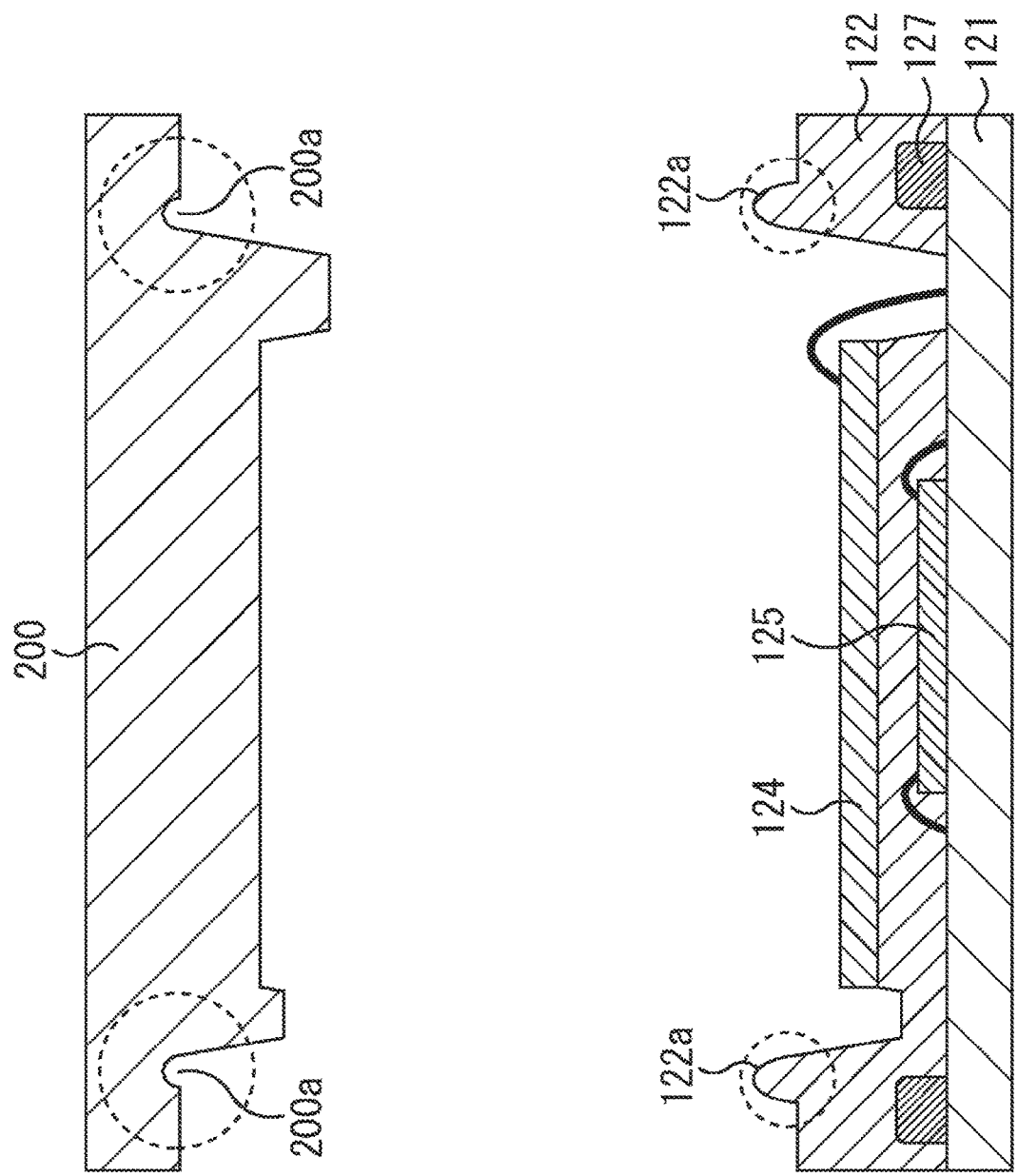
FIG. 4 is a view explaining shaping the mold during manufacture of a package substrate of the imaging apparatus shown in FIG. 3.

More particularly, the mold 122 is shaped as shown in FIG. 4. In the example shown in FIG. 4, the mold 122 is shaped with a die 200. The die 200 is provided with concave portions 200a at regions indicated by dashed line circles in FIG. 4. The concave portions 200a are formed in a shape corresponding to the protrusions 122a.

Each of the concave portions 200a is configured as a circular or rectangular recess, for example. A diameter of the circle or a width of the rectangle is set to, for example, from 1 μm to a seal width. Herein, the seal width is defined as an overlap length of the seal surface of the mold 122 and the glass 123. The recess is set to have a depth of from 1 μm to 1 mm, favorably from 50 μm to 100 μm.

Accordingly, the protrusion 122a is configured as a circular or rectangular protrusion, for example. A diameter of the circle or a width of the rectangle is set to, for example, from 1 µm to the seal width. Further, the protrusion is set to have a height of from 1 µm to 1 mm, favorably from 50 µm to 100 µm.

Figure 5:
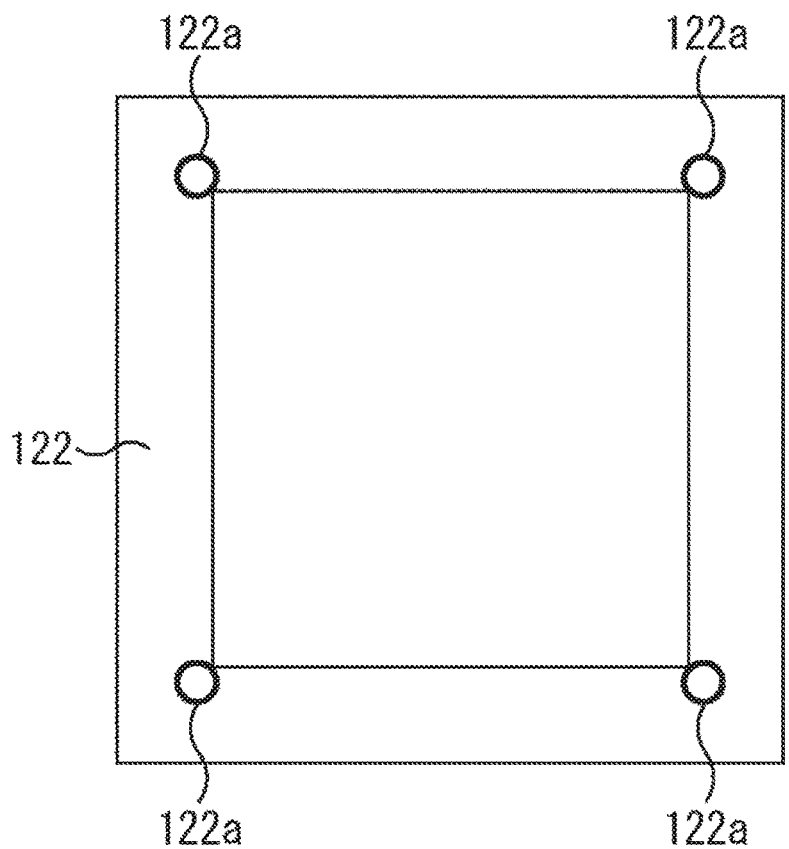
FIG. 5 is a plane view of the mold shown in FIG. 3.

FIG. 5 is a plane view of the mold 122 shown in FIG. 3. As shown in FIG. 5, the protrusions 122a are provided at four corners of the rectangular mold 122.

Note that, although the mold 122 is provided with the four protrusions 122a in the example shown in FIG. 5, at least three protrusions 122a only need to be provided. For example, protrusions 122a may be provided at the three corners out of the four corners of the rectangular mold 122. Alternatively, one protrusion 122a may be provided at a middle of a side of the rectangular mold 122 and protrusions 122a may be provided at both ends of a side opposed thereto.

Due to the provision of at least three protrusions 122a, the glass 123 is stably disposed thereon.

Figure 6:
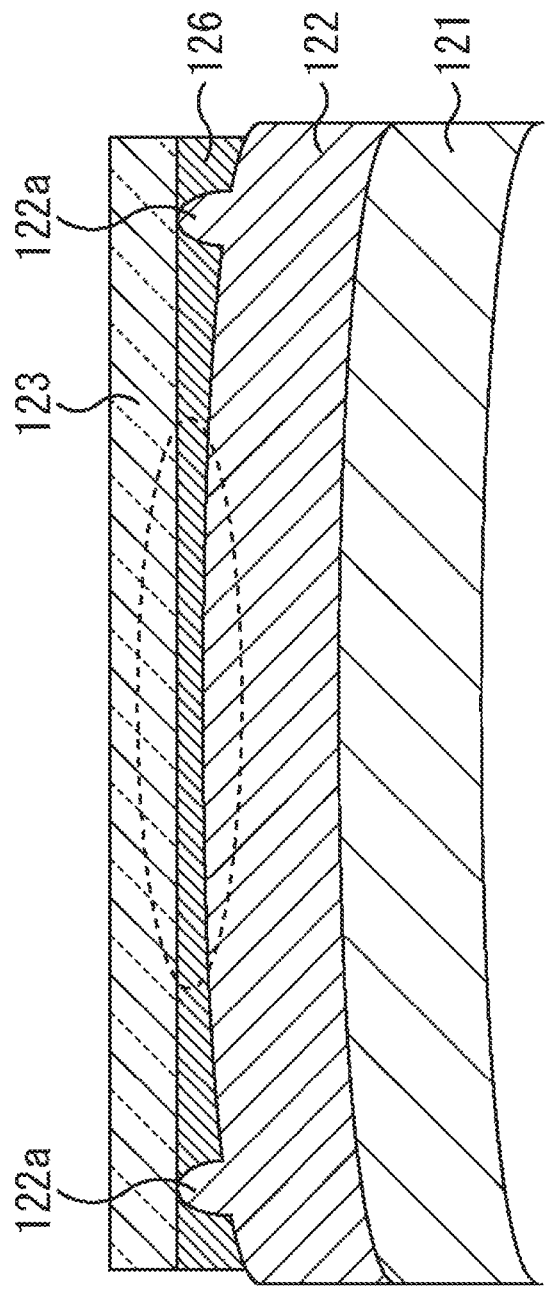
FIG. 6 is a cross-sectional view showing a bonding portion between a seal surface of the mold and glass that are shown in FIG. 3.

FIG. 6 is a cross-sectional view showing a bonding portion between the seal surface of the mold 122 and the glass 123 that are shown in FIG. 3. In FIG. 6, the seal surface of the mold 22 is bent back at the center in FIG. 6 and the center of the mold 122 is slightly pushed up. Therefore, the mold 22 is slightly high at the center thereof in FIG. 6 and slightly low at left and right ends thereof in FIG. 6.

Unlike the case shown in FIG. 2, in the case shown in FIG. 6, a sufficient amount of adhesive 126 remains near the center in FIG. 6 in a layer of the adhesive 126 inserted between the glass 123 and the seal surface of the mold 122. Thus, in FIG. 6, no void defect is generated in the layer of the adhesive 126.

In the case shown in FIG. 6, the protrusions 122a are in contact with the lower surface of the glass 123 in FIG. 6, and hence the glass 123 is pushed up in FIG. 6 in comparison with the case shown in FIG. 2. Therefore, a space between the seal surface of the mold 122 and the lower surface of the glass 123 in FIG. 6 is formed, and hence a sufficient amount of adhesive 126 can be inserted into the space.

As described above, in the imaging apparatus 100 to which the present technology is applied, a void defect can be prevented in the layer of the adhesive 126, and hence the glass 123 can be suitably fixed. Thus, according to the present technology, it is possible to reduce changes in rays incident upon the light reception surface of the image sensor 124 and particles caught between the light reception surface of the image sensor 124 and the glass 123.

Further, the above-mentioned protrusions 122a are formed in shaping the mold, and hence can be formed only by providing the die 200 with the concave portions 200a. Thus, the present technology can be easily implemented introduced at low costs without needing to change the manufacture line and material used in the related art, for example.

Although the example in which the glass is disposed on the mold has been described above, those disposed on the mold are not limited to the glass and, for example, it may be a light-transmissive member (translucent member) made of a synthetic resin or the like.

Although the example in which the glass or translucent member is flat has been described, for example, a lens obtained by changing the thickness of the glass or translucent member between the center and the periphery may be employed.

Alternatively, for example, a lens holder that fixes a lens formed of the glass or translucent member may be disposed on the mold instead of directly disposing the glass or translucent member on the mold. For example, legs of the lens holder may be in contact with the seal surface of the mold and the above-mentioned protrusions 122a may be in contact with the legs of the lens holder, such that a space can be formed between the seal surface of the mold 122 and the legs of the lens holder.

Also in these cases, it is still possible to prevent the void defect in the layer of the adhesive, and hence to suitably fix the glass holder.

Figure 7:
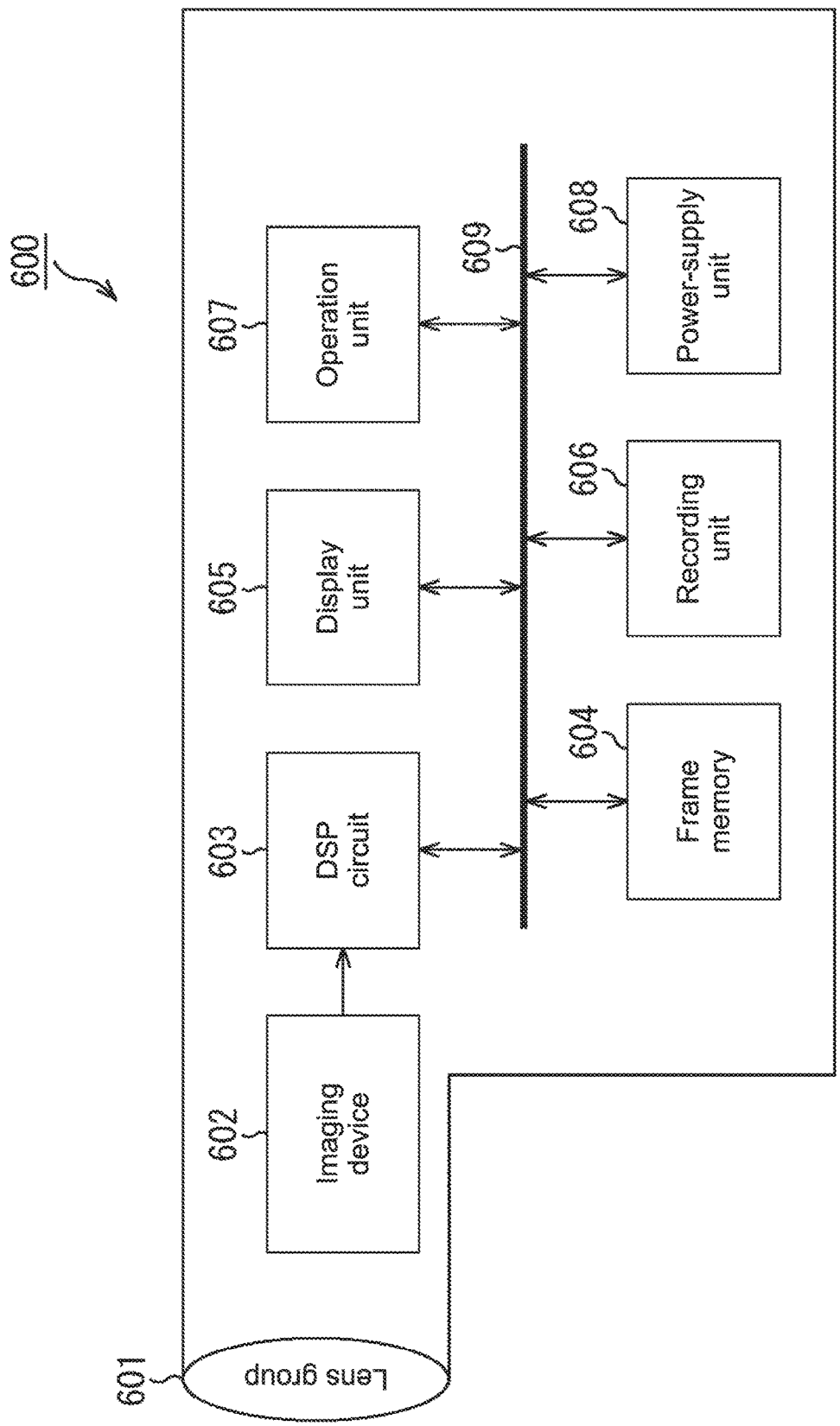
FIG. 7 is a block diagram showing a configuration example of the imaging apparatus as an electronic apparatus to which the present technology is applied.

FIG. 7 is a block diagram showing a configuration example of the imaging apparatus as an electronic apparatus to which the present technology is applied.

An imaging apparatus 600 shown in FIG. 7 includes an optical system 601 consisting of a lens group, an imaging device 602, and a DSP circuit 603 serving as a camera signal processing circuit. The imaging apparatus 600 further includes a frame memory 604, a display unit 605, a recording unit 606, an operation unit 607, and a power-supply unit 608. The DSP circuit 603, the frame memory 604, the display unit 605, the recording unit 606, the operation unit 607, and the power-supply unit 608 are connected to one another via a bus line 609.

The optical system 601 captures incident light (image light) from a subject and forms an image of incident light on an imaging surface of the imaging device 602. The imaging device 602 converts an amount of incident light focused on the imaging surface by the optical system 601 into an electrical signal per pixel and outputs the electrical signal as a pixel signal. As this imaging device 602, an imaging device including the imaging apparatus 100 according to the above-mentioned embodiment and the like can be used.

The display unit 605 is formed of a panel type display apparatus such as a liquid-crystal panel and an organic electro luminescence (EL) panel and displays moving or still images captured by the imaging device 602. The recording unit 606 records the moving or still images captured by the imaging device 602 in a recording medium such as a video tape and a digital versatile disk (DVD).

The operation unit 607 issues operation instructions about various functions of the imaging apparatus 600 according to operations made by a user. The power-supply unit 608 appropriately supplies the DSP circuit 603, the frame memory 604, the display unit 605, the recording unit 606, and the operation unit 607 with various powers for operating them.

The present technology is not limited to be applied to the imaging apparatus that detects a distribution of incident light amounts of visible light and captures them as an image. The present technology is applicable to general imaging apparatuses (physical quantity distribution detection apparatuses) including an imaging apparatus that captures a distribution of incident amounts of infrared rays, X-rays, particles, or the like as an image, a fingerprint detection sensor that detects a distribution of other physical quantities such as a pressure and a capacitance in a broad sense and captures it as an image, and the like.

Note that embodiments of the present technology are not limited to the above-mentioned embodiments and various modifications may be made without departing from the gist of the present technology.

Note that the present technology may also take the following configurations.

(1) An imaging apparatus, including:
an interposer on which an image sensor including a light reception section is disposed;
a translucent member that is provided on the light reception section; and a mold that is formed in sides of the interposer having a rectangular shape and bonded to the translucent member to support the translucent member, the mold including a seal surface that is bonded to the translucent member, the seal surface being provided with a protrusion.

(2) The imaging apparatus according to (1), in which the protrusion includes at least three protrusions.

(3) The imaging apparatus according to (1), in which the light reception surface of the image sensor and the translucent member have a hollow structure therebetween.

(4) The imaging apparatus according to (1), in which the mold and the translucent member are bonded to each other with one of a thermosetting resin and an ultraviolet curing resin.

(5) The imaging apparatus according to (1), in which the mold is made of an epoxy resin composition.

(6) The imaging apparatus according to (1), in which the protrusion is formed by shaping the mold with a die.

(7) The imaging apparatus according to (1), in which the protrusion is configured as a protrusion having one of a circular shape and a rectangular shape, and one of the circular shape and the rectangular shape of the protrusion has one of a diameter and a width of from 1 µm to an overlap length of the seal surface and the translucent member.

(8) The imaging apparatus according to (1), in which the protrusion has a height of from 1 µm to 1 mm.

(9) The imaging apparatus according to (8), in which the protrusion has a height of from 50 µm to 100 µm.

(10) The imaging apparatus according to (1), in which the interposer is made of one of a glass epoxy and a ceramic.

(11) The imaging apparatus according to (1), in which on the interposer, a signal processing chip having a function as one of an analog-to-digital converter (DC) and a digital signal processor (DSP) is further disposed.

(12) An electronic apparatus, including an imaging apparatus including
an interposer on which an image sensor including a light reception section is disposed,
a translucent member that is provided on the light reception section, and
a mold that is formed in sides of the interposer having a rectangular shape and bonded to the translucent member to support the translucent member, the mold including a seal surface that is bonded to the translucent member, the seal surface being provided with a protrusion.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging system, comprising:
an optical system; and
an imaging apparatus configured to receive incident light from the optical system and generate an image signal based on the incident light,
a processor configured to perform signal processing on the image signal,
the imaging apparatus including:
an interposer;
a mold disposed on the interposer, wherein the mold includes at least one protrusion in a cross sectional view;
an image sensor disposed on the interposer; and
a translucent member having a first side that receives the incident light and a second side that opposes the first side, wherein the second side is coupled to the mold such that the image sensor is spaced apart from the translucent member,
wherein the image sensor is disposed between the translucent member and the interposer, and
wherein at least a portion of the second side of the translucent member is in direct contact with at least a portion of the at least one protrusion.

2. The imaging system according to claim 1, wherein the at least one protrusion extends away from the image sensor in the cross sectional view.

3. The imaging system according to claim 1, wherein the portion of the second side of the translucent member is in direct contact with a tip of the at least one protrusion.

4. The imaging system according to claim 1, wherein the interposer has a first side that faces the image sensor, and
wherein the mold is disposed on the first side of the interposer.

5. The imaging system according to claim 1, wherein the translucent member is attached to the mold by an adhesive.

6. The imaging system according to claim 1, wherein the interposer comprises a substantially rectangular shape having four sides, and
wherein the mold is disposed on the interposer at locations corresponding to the four sides of the substantially rectangular shape.

7. The imaging system according to claim 1, wherein the processor comprises a signal processing chip, and
wherein the signal processing chip is electrically coupled to the interposer, and wherein the image sensor is electrically coupled to the interposer.

8. The imaging system according to claim 7, wherein the image sensor is disposed between the signal processing chip and the translucent member.

9. The imaging system according to claim 1, wherein the mold and the translucent member are bonded to each other with one of a thermosetting resin and an ultraviolet curing resin.

10. The imaging system according to claim 1, wherein the mold includes a resin.

11. The imaging system according to claim 1, wherein the at least one protrusion comprises a circular shape having a diameter that is more than 1 µm.

12. The imaging system according to claim 1, wherein the at least one protrusion extends from a surface of the mold by 1 µm to 1 mm.

13. The imaging system according to claim 1, wherein the at least one protrusion extends from a surface of the mold by 50 µm to 100 µm.

14. The imaging system according to claim 1, wherein the interposer is made of one of a glass epoxy and a ceramic.

15. The imaging system according to claim 1, further comprising a capacitor and a resistor disposed on the interposer.

16. An imaging system, comprising:
an optical system;
an interposer;
a mold disposed on the interposer, wherein the mold includes at least one protrusion in a cross sectional view;
an image sensor disposed on the interposer and configured to receive incident light from the optical system and generate an image signal based on the incident light; and a translucent member having a first side that receives the incident light and a second side that opposes the first side, wherein the second side is coupled to the mold such that the image sensor is spaced apart from the translucent member, wherein the image sensor is disposed between the translucent member and the interposer, and wherein at least a portion of the second side of the translucent member is in direct contact with at least a portion of the at least one protrusion.

17. The imaging system according to claim 16, wherein the interposer has a first side that faces the image sensor, wherein the mold is disposed on the first side of the interposer, wherein the translucent member is attached to the mold by an adhesive, and wherein the mold includes a resin.

18. The imaging system according to claim 16, further comprising a signal processing chip, wherein the signal processing chip is electrically coupled to the interposer, wherein the image sensor is electrically coupled to the interposer, and wherein the image sensor is disposed between the signal processing chip and the translucent member.

19. An imaging system, comprising:

an optical system;

an interposer;

a mold disposed on the interposer, wherein the mold includes at least one protrusion in a cross sectional view;

an image sensor disposed on the interposer and configured to receive incident light from the optical system and generate an image signal based on the incident light;

a translucent member having a first side that receives the incident light and a second side that opposes the first side, wherein the second side is coupled to the mold such that the image sensor is spaced apart from the translucent member; and a display configured to receive the image signal generated by the image sensor, wherein the image sensor is disposed between the translucent member and the interposer, and wherein at least a portion of the second side of the translucent member is in direct contact with at least a portion of the at least one protrusion.

20. The imaging system according to claim 16, further comprising a signal processing chip, wherein the signal processing chip is electrically coupled to the interposer, wherein the image sensor is electrically coupled to the interposer, wherein the image sensor is disposed between the signal processing chip and the translucent member, wherein the interposer has a first side that faces the image sensor, wherein the mold is disposed on the first side of the interposer, wherein the translucent member is attached to the mold by an adhesive, and wherein the mold includes a resin.

* * * * *